(12) United States Patent
Havanur

(10) Patent No.: US 8,633,512 B2
(45) Date of Patent: Jan. 21, 2014

(54) DEVICE AND ASSOCIATED SEMICONDUCTOR PACKAGE FOR LIMITING DRAIN-SOURCE VOLTAGE OF TRANSFORMER-COUPLED PUSH PULL POWER CONVERSION CIRCUIT

(75) Inventor: Sanjay Havanur, Cupertino, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 93 days.

(21) Appl. No.: 13/455,003

(22) Filed: Apr. 24, 2012

(65) Prior Publication Data

US 2012/0205745 A1  Aug. 16, 2012

Related U.S. Application Data

(60) Division of application No. 13/035,893, filed on Feb. 25, 2011, now Pat. No. 8,264,861, which is a continuation of application No. 12/118,295, filed on May 9, 2008, now Pat. No. 7,898,831.

(51) Int. Cl.
  *H01L 29/74* (2006.01)
(52) U.S. Cl.
  USPC .. 257/140; 363/56.08; 257/603; 257/E29.257
(58) Field of Classification Search
  USPC ........................................ 257/140; 363/56.08
  See application file for complete search history.

(56) References Cited

U.S. PATENT DOCUMENTS

2008/0258224 A1* 10/2008 Hshieh ........................ 257/356
2010/0289059 A1* 11/2010 Hsieh ............................ 257/140

* cited by examiner

*Primary Examiner* — Stephen W Smoot
*Assistant Examiner* — Edward Chin
(74) *Attorney, Agent, or Firm* — Chein-Hwa Tsao; CHEmily LLC

(57) ABSTRACT

A circuit is proposed for limiting maximum switching FET drain-source voltage (VDS) of a transformer-coupled push pull power converter with maximum DC supply voltage $V_{IN\_MAX}$. Maximum VDS is accentuated by leakage inductances of the push pull transformer and the power converter circuit traces. The limiting circuit bridges the drains of the switching FETs and it includes two serially connected opposing Zener diodes each having a Zener voltage Vzx. The invention is applicable to both N-channel and P-channel FETs. In a specific embodiment, Vzx is selected to be slightly $\geq 2^*V_{IN\_MAX}$ with the maximum VDS clamped to about $V_{IN\_MAX}+\frac{1}{2}Vzx$. In another embodiment, a proposed power switching device with integrated VDS-clamping includes a switching FET; and a Zener diode having a first terminal and a second terminal, the second terminal of the Zener diode is connected to the drain terminal of the switching FET.

10 Claims, 11 Drawing Sheets

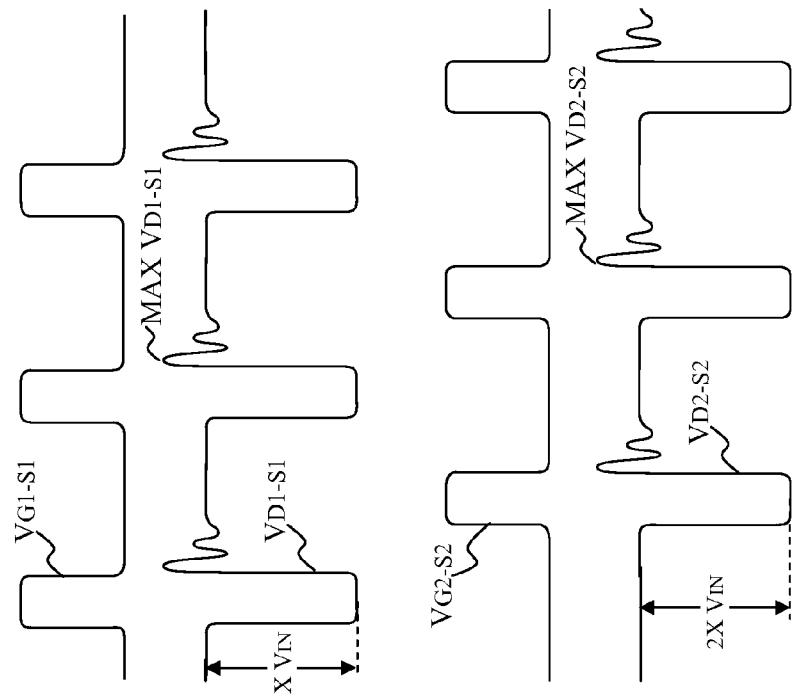
Fig. 2A PRESENT INVENTION
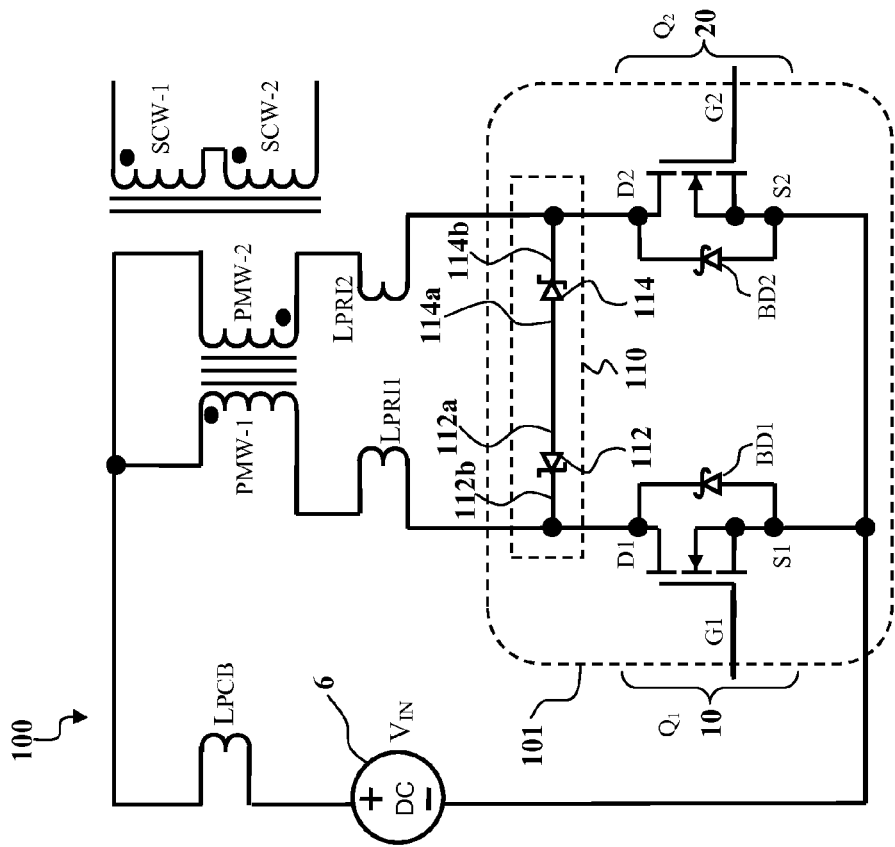
Fig. 2B PRESENT INVENTION

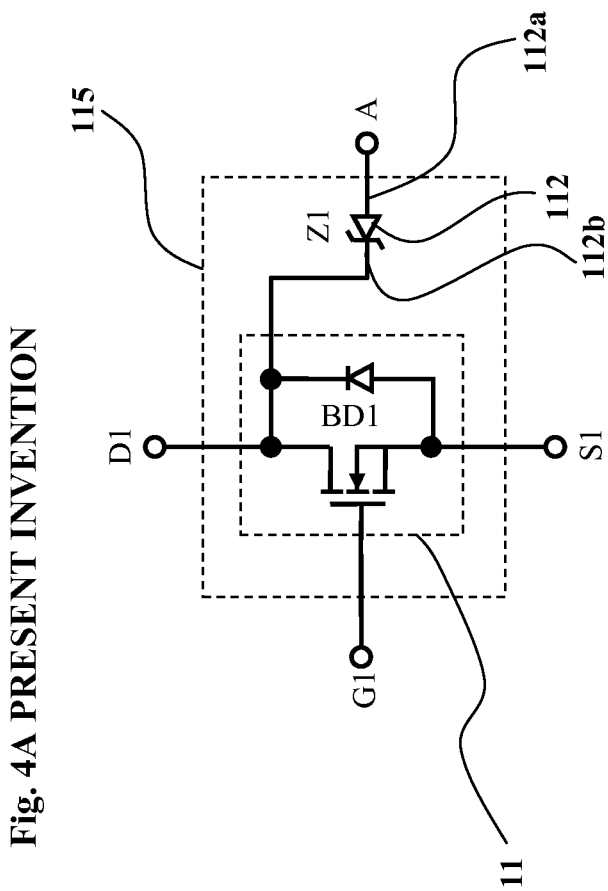
Fig. 4A PRESENT INVENTION

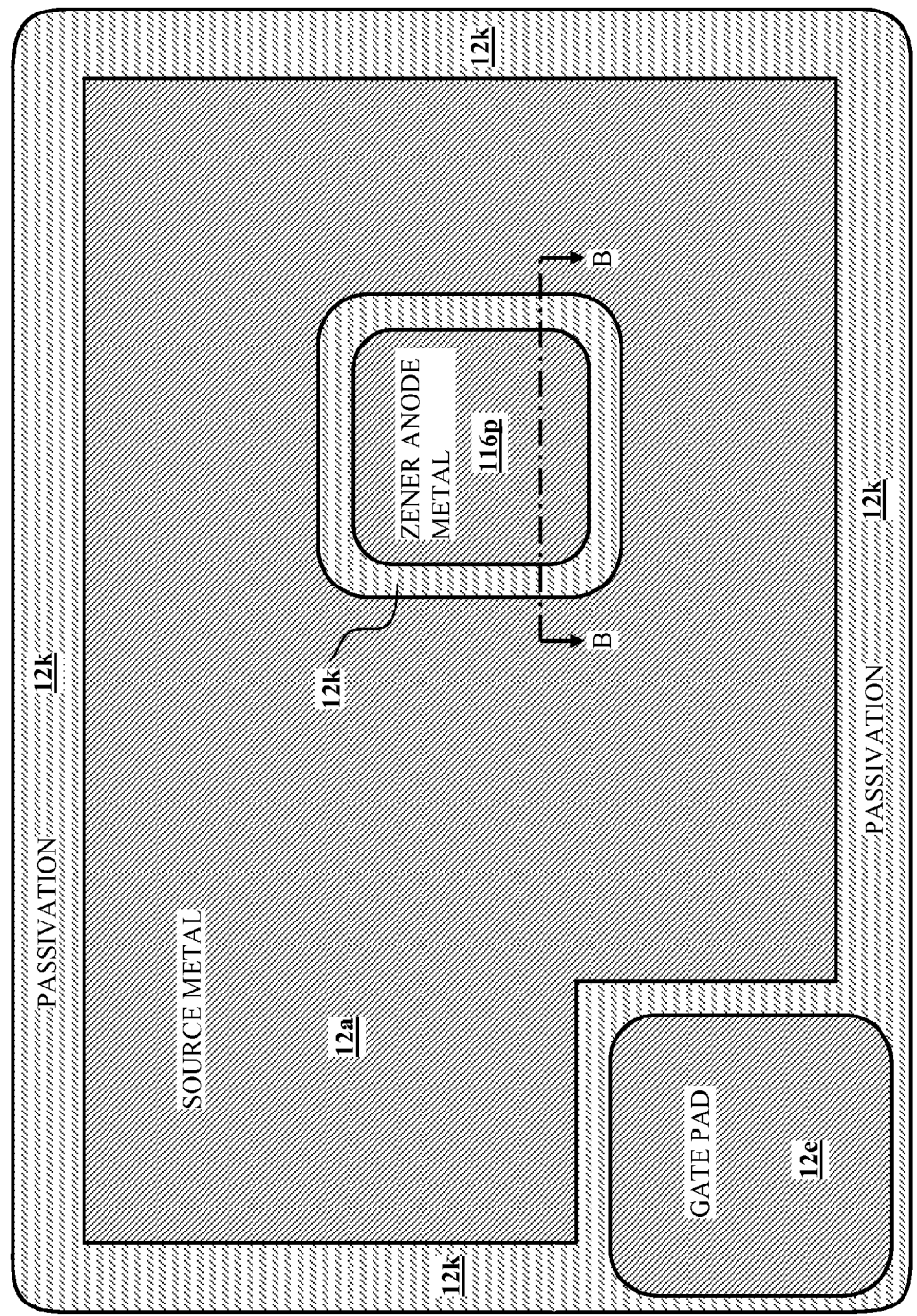
Fig. 4B PRESENT INVENTION

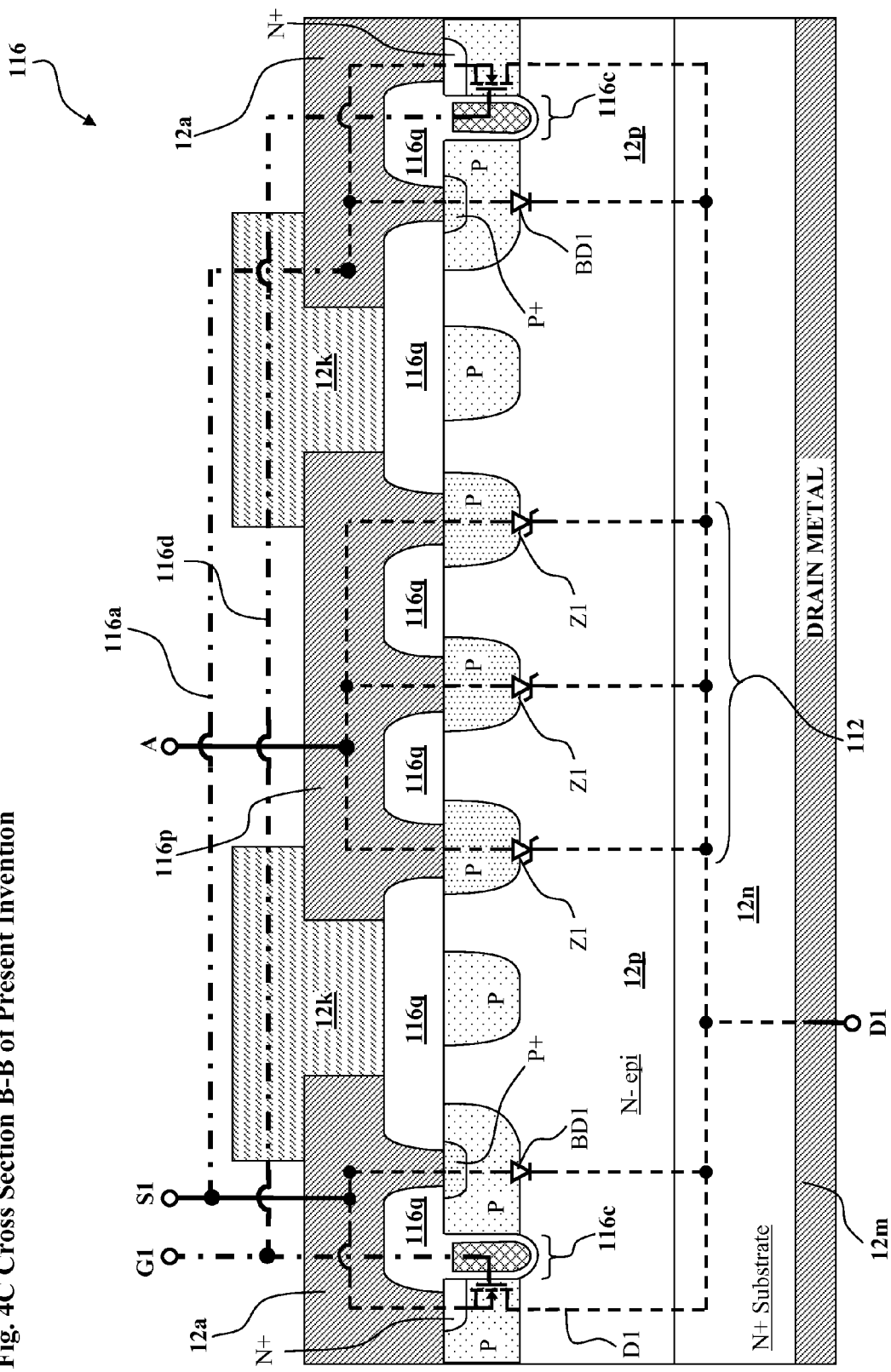
Fig. 4C Cross Section B-B of Present Invention

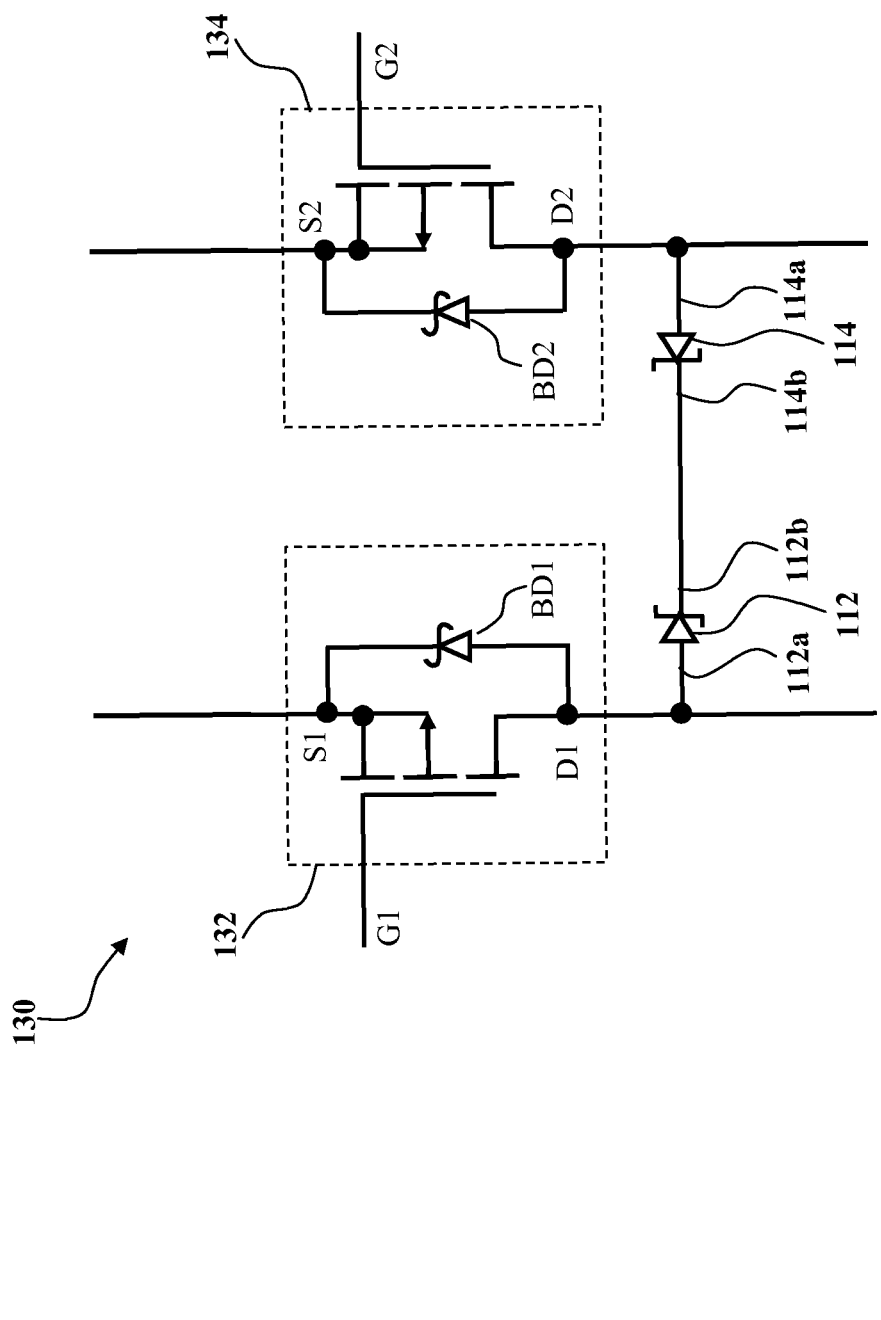
Fig. 5A PRESENT INVENTION (P-channel)

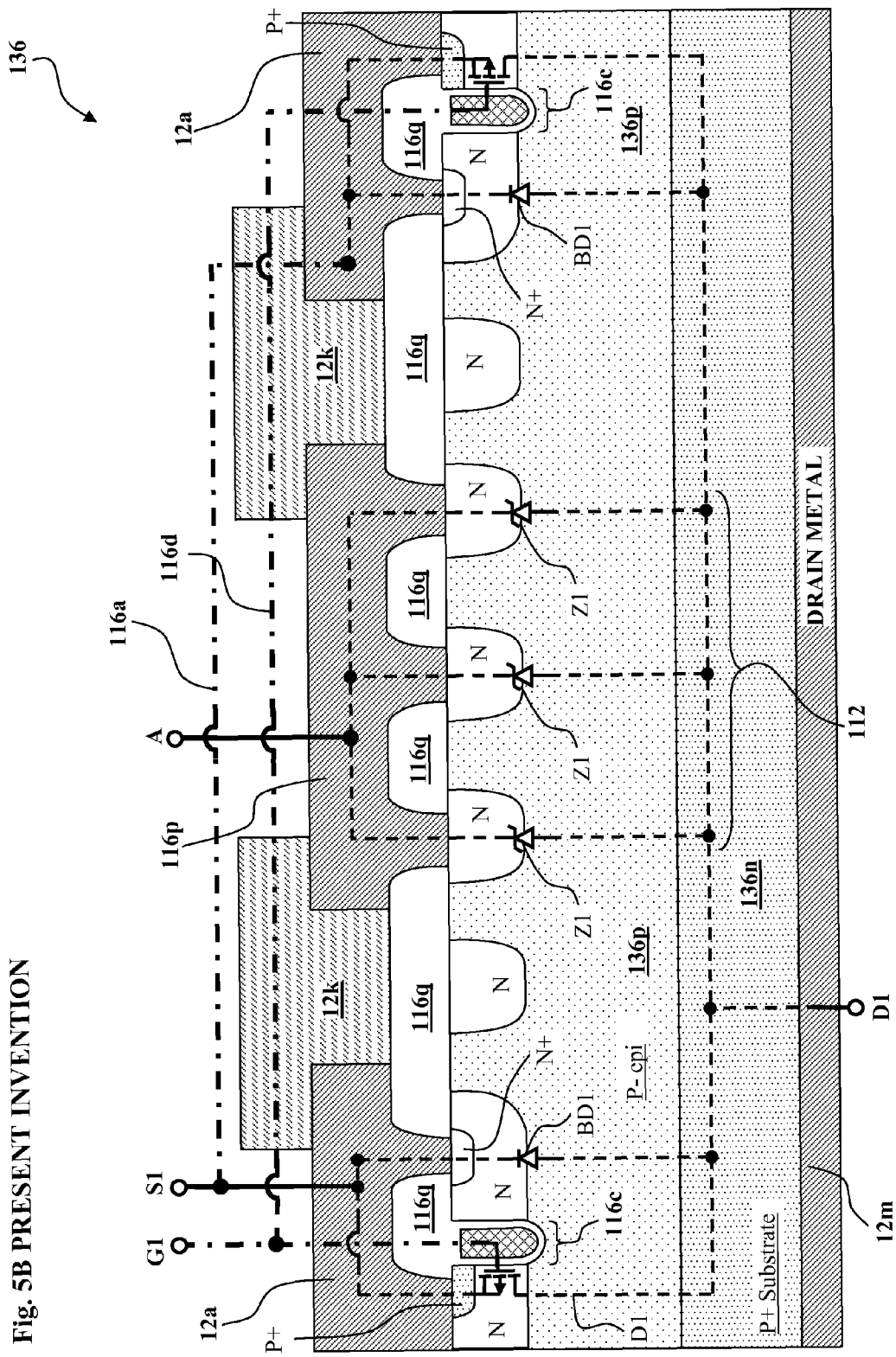
Fig. 5B PRESENT INVENTION

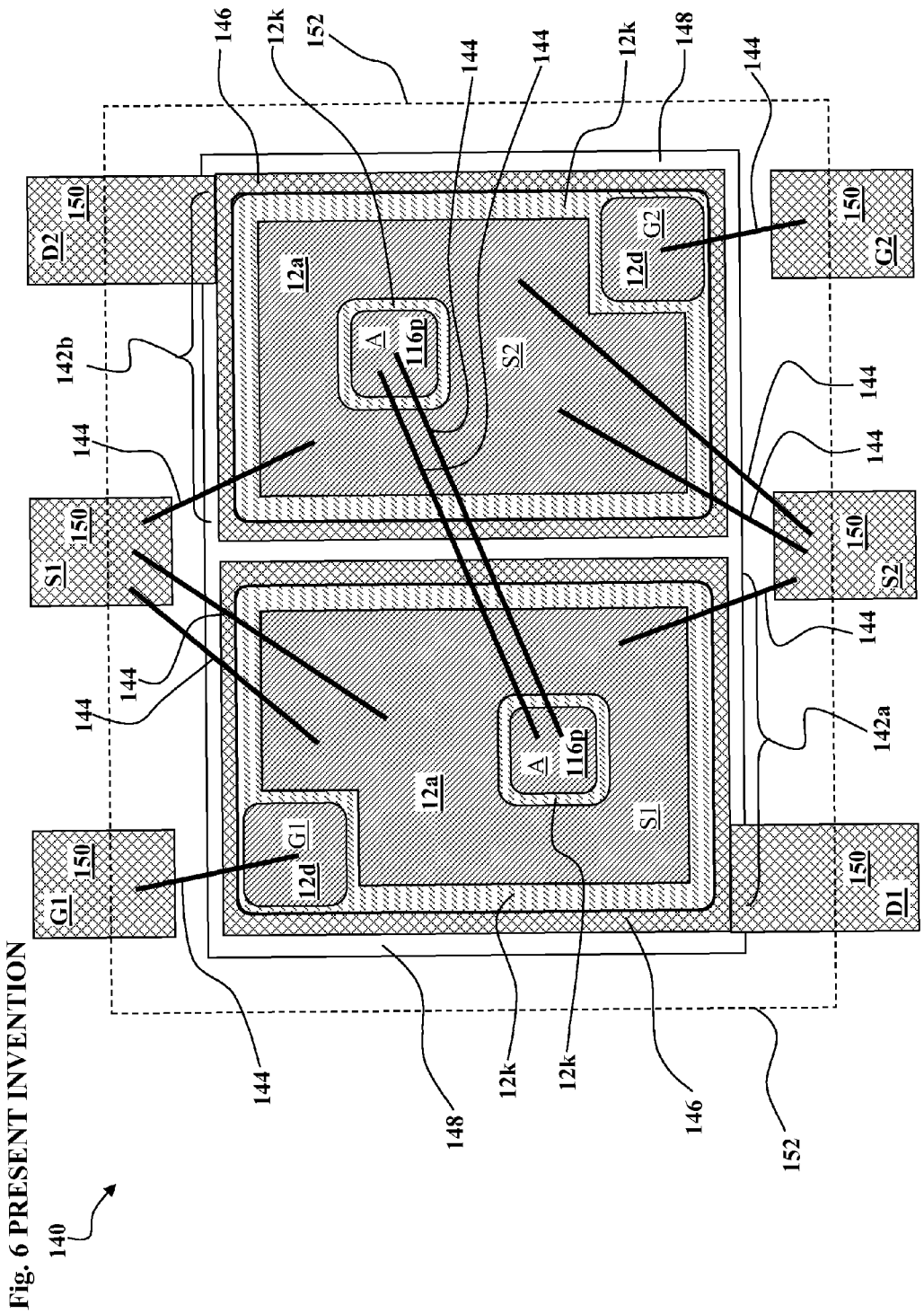
Fig. 6 PRESENT INVENTION

DEVICE AND ASSOCIATED SEMICONDUCTOR PACKAGE FOR LIMITING DRAIN-SOURCE VOLTAGE OF TRANSFORMER-COUPLED PUSH PULL POWER CONVERSION CIRCUIT

CROSS REFERENCE TO RELATED APPLICATIONS

This application is a divisional application of a previously filed pending application entitled "Device and Method for Limiting Drain-Source Voltage of Transformer-Coupled Push Pull Power Conversion Circuit" by Sanjay Havanur, with an application Ser. No. 13/035,893 and filing date of Feb. 25, 2011 now U.S. Pat. No. 8,264,861.

In turn, the application is a continuation of a previously filed pending application entitled "Device and Method for Limiting Drain-Source Voltage of Transformer-Coupled Push Pull Power Conversion Circuit", by Sanjay Havanur with an application Ser. No. 12/118,295 and filing date of May 9, 2008 now U.S. Pat. No. 7,898,831.

Hence, the contents are all incorporated by reference herein for any and all purposes.

FIELD OF INVENTION

This invention relates generally to the field of power electronics. More specifically, the present invention is directed to voltage overshoot control and suppression in a power switching circuit.

BACKGROUND OF THE INVENTION

The usage of power switching circuits has become ubiquitous in the electronics industry. A few examples of applications are switching power supplies, DC-DC voltage converters and DC-AC voltage converters.

During the operation of such power switching circuits, a frequently encountered situation is when power switching devices such as MOSFETs (Metal-Oxide-Semiconductor Field Effect Transistors) are turned off against unclamped or partially clamped inductive loads. During the turn off, a high rate of load current change, abbreviated as di/dt, is often impressed upon these inductive loads due to the gate drive of the power MOSFET device. This normally results in an associated voltage overshoot and ringing as the leakage inductive energy stored in the unclamped circuit inductances resonates with parasitic circuit capacitances before dying down. Excessive ringing can cause power losses and excessive peak voltages from the voltage overshoot can drive the power MOSFET device into avalanche breakdown with the risk of permanent device failure. Additionally, the voltage overshoot and ringing can also result in high levels of conducted and/or radiated EMI/RFI (electromagnetic interference/radio frequency interference) causing undesirable interference with the operation of other sensitive electronic systems nearby.

A number of studies have been conducted of the voltage overshoot and ringing phenomenon so as to minimize its adverse effects. Subsequent solutions include adding snubbers across the MOSFETs, slowing down the turn off speed by reducing the gate turn off current, etc. Such solutions typically either require many additional components and/or are inefficient. Therefore, there exists a need to cost effectively reduce such associated voltage overshoot and ringing as caused by the high rate of load current change di/dt. The following is a list of references relevant to the understanding of the present invention:

1. F Merienne, J Roudet, J. L. Schanen, "Switching disturbance due to source inductance for a power MOSFET: analysis and solutions", IEEE Power Electronics Specialists Conference, PESC 1996 Record, Vol 2, pp 1743-1747.
2. G Nobauer, D Ahlers and J Ruiz-Sevillano, "A method to determine parasitic inductances in Buck Converter topologies" Infineon Application Note, June 2004.
3. Qun Zhao, Goran Stojcic, "Characterization of Cdv/dt induced power loss in Synchronous Buck DC-DC converters", IEEE Applied Power Electronics Conference, APEC 2004, Vol 1, pp 292-297.
4. Bo Yang, Jason Zhang "Effect and Utilization of Common Source Inductance in Synchronous Rectification", IEEE Applied Power Electronics Conference, APEC 2005, Vol 3, pp 1407-1411.
5. W Teulings, J. L. Schanen, J Roudet, "MOSFET switching behavior under influence of PCB stray inductance", IEEE Industry Applications Conference, 1996. Vol 3, pp 1449-1453.

SUMMARY OF THE INVENTION

A circuit is proposed for limiting the maximum drain-source voltage (VDS) of the switching FETs of a transformer-coupled push pull power converter with a maximum DC supply voltage $V_{IN\_MAX}$. The maximum VDS is accentuated by leakage inductances of the push pull transformer and the power converter circuit traces. The limiting circuit bridges the drains of the switching FETs and it further includes a series connection of two opposing Zener diodes each having a Zener voltage of Vzx. The invention is applicable to both N-channel and P-channel FETs.

In a more specific embodiment, the Vzx is selected to be slightly $\geq 2*V_{IN\_MAX}$ thus the two opposing Zener diodes clamp the maximum VDS to a value of about $V_{IN\_MAX}+\frac{1}{2}Vzx$.

In another embodiment, a proposed power switching device with integrated VDS-clamping includes:
a) A switching FET having a source terminal, a drain terminal and a gate terminal.
b) A Zener diode with a Zener voltage of Vzx and having a first terminal and a second terminal, the second terminal of the Zener diode is further connected to the drain terminal. Upon connection of two of the power switching devices with integrated VDS-clamping as the pair of switching FETs of a transformer-coupled push pull power converter with a maximum DC supply voltage $V_{IN\_MAX}$ and having the first terminals of the two Zener diodes connected to each other, the two power switching devices with integrated VDS-clamping perform an associated task of push pull power switching while clamping the maximum VDS to a value of about $V_{IN\_MAX}+\frac{1}{2}Vzx$.

In a more specific embodiment, the switching FET is an N-channel FET and the second terminal of the Zener diode is its cathode.

In an alternative more specific embodiment, the switching FET is a P-channel FET and the second terminal of the Zener diode is its anode.

In a more specific embodiment with an N-channel switching FET, the switching FET is a bottom-drain trench FET, the Zener diode is a bottom-cathode device and the switching FET and the Zener diode are further formed on a single die by sharing their respective bottom-drain and bottom-cathode with a common N-layer atop the die substrate.

A method is proposed for limiting the maximum drain-source voltage (VDS) of the switching FETs of a transformer-coupled push pull power converter with a maximum DC supply voltage $V_{IN\_MAX}$. The maximum VDS is accentuated by leakage inductances of the push pull transformer and the power converter circuit traces. The method includes automatically producing, upon a tendency of the VDS to exceed a maximum value VDSmax, an inter-drain current flow between the drains of the switching FETs with a concomitant energy dissipation thus limiting the maximum VDS.

In a more specific embodiment, automatically producing an inter-drain current flow further includes providing a circuit bridging the drains of the switching FET. The bridging circuit further exhibits a non-destructive conductive breakdown upon tendency of the VDS of any of the switching FETs to exceed a pre-determined limit.

In a more specific embodiment, providing the bridging circuit further includes providing a series connection of two opposing Zener diodes. Each Zener diode has a Zener voltage of Vzx, selected to be slightly $\geq 2*V_{IN\_MAX}$, thus results in a VDSmax value of about $V_{IN\_MAX}+\frac{1}{2}Vzx$.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 2A and FIG. 2B illustrate a present invention transformer-coupled push pull power conversion circuit and its internal signal waveforms;

FIG. 4A and FIG. 4B illustrate a present invention power switching device with integrated VDS-clamping using an N-channel FET and a top view of its corresponding semiconductor die structure;

FIG. 4C illustrates a sectional view of a semiconductor die structure corresponding to the present invention power switching device with integrated VDS-clamping using an N-channel FET;

FIG. 5A illustrates a bridging circuit with integrated VDS-clamping using P-channel FETs under the present invention for limiting the maximum VDS of the switching FETs of a transformer-coupled push pull power converter;

FIG. 5B illustrates a sectional view of a semiconductor die structure corresponding to the present invention power switching device with integrated VDS-clamping using P-channel FETs; and FIG. 6 illustrates the top view of two packaged semiconductor dies each corresponding to the present invention power switching device with integrated VDS-clamping.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1B:
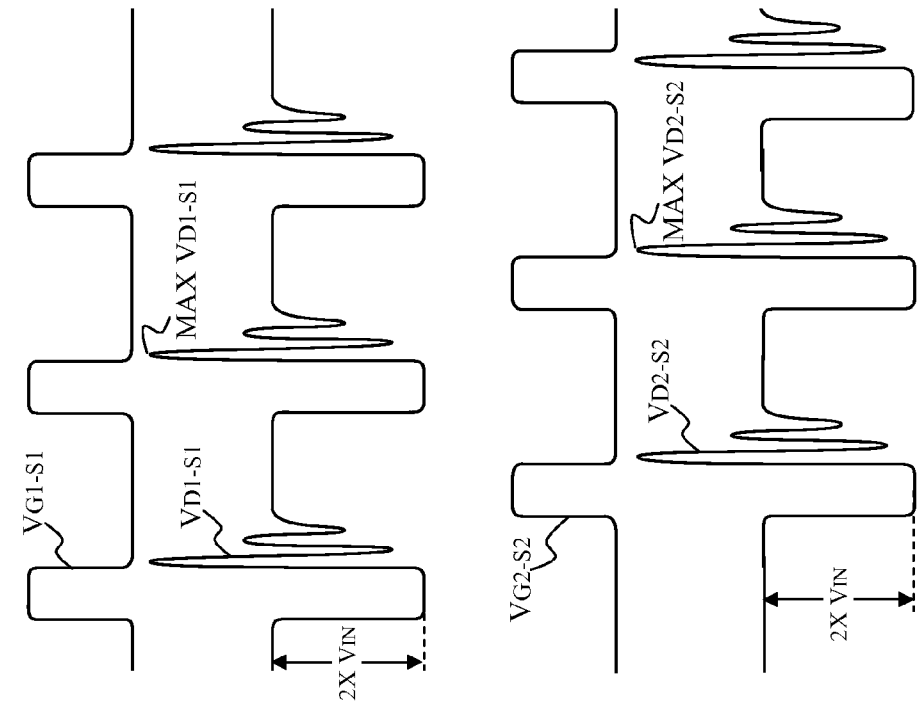
FIG. 1A and FIG. 1B illustrate a prior art transformer-coupled push pull power conversion circuit and its internal signal waveforms.
Figure 1A:
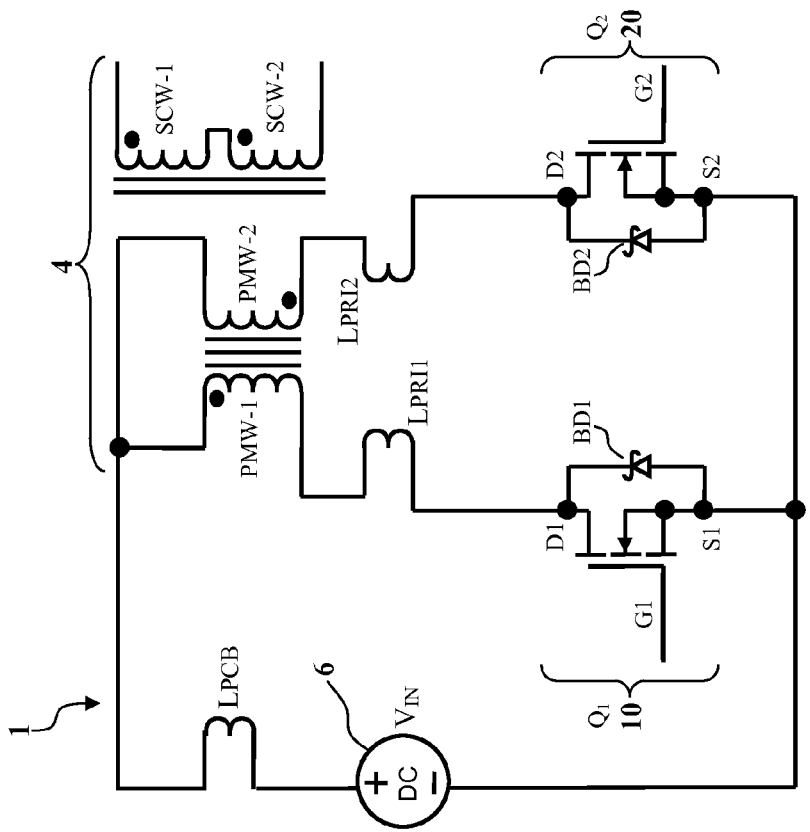

FIG. 1A and FIG. 1B illustrate a prior art transformer-coupled push pull power conversion circuit 1 and its internal signal waveforms. A pair of switching FET Q1 10 and switching FET Q2 20 alternately switch a high side load current, originally supplied by a DC supply 6 of voltage $V_{IN}$, respectively through the primary windings PMW-1 and PMW-2 of a push-pull transformer 4. The associated switching power is then magnetically coupled to the secondary windings SCW-1 and SCW-2 for delivery to an external load (not shown here). The alternately switching sequence of the switching FETs Q1 10 and Q2 20 is caused by control signal waveforms gate-source voltage $V_{G1-S1}$ (applied between gate G1 and source S1 of the switching FET Q1 10 which also has a built-in body diode BD1 and drain D1) and gate-source voltage $V_{G2-S2}$ (applied between gate G2 and source S2 of the switching FET Q2 20 which also has a built-in body diode BD2 and drain D2). Inherently, the prior art push pull power conversion circuit 1 has numerous leakage inductances along the load current path. As illustrated, the leakage inductances include a primary leakage inductance $L_{PRI1}$ of the primary winding PMW-1, a primary leakage inductance $L_{PRI2}$ of the primary winding PMW-2 and a printed circuit board (PCB) trace inductance $L_{PCB}$ associated with circuit traces making up the load current path. To those skilled in the art, upon an abrupt switching off of the switching FET Q1 10, the dissipation of stored magnetic energy in the transformer and leakage inductances causes its drain-source voltage $V_{D1-S1}$ to spike and ring with a peak drain-source voltage MAX $V_{D1-S1}$. As an illustration, the switching FET Q1 10 is abruptly switched off with a down transition of the gate-source voltage $V_{G1-S1}$. It should be noted that the inherent operation (even with perfect clamping of the voltage spike) of the transformer-coupled push pull power conversion circuit brings the drain-source voltage $V_{D1-S1}$ to $2*V_{IN}$. However the abrupt switching off of FET Q1 10 induces a voltage spike which makes the maximum drain-source voltage, MAX $V_{D1-S1}$, substantially higher than twice the maximum DC supply voltage $V_{IN\_MAX}$. This spiking and ringing of the drain-source voltage $V_{D1-S1}$ is undesirable as they cause EMI/RFI and, when excessive in amplitude, can cause an avalanche drain-source (D1-S1) breakdown of the switching FET Q1 10. Similarly, upon an abrupt switching off of the switching FET Q2 20, the dissipation of stored magnetic energy in the leakage inductances causes its drain-source voltage $V_{D2-S2}$ to undesirably spike and ring with a peak drain-source voltage MAX $V_{D2-S2}$. In order to ensure safe operation, FETs with a breakdown voltage rating much greater than $2*V_{IN\_MAX}$ must be selected, which is inefficient and entails higher on resistance (Rdson) and/or cost.

FIG. 2A and FIG. 2B illustrate the present invention transformer-coupled push pull power conversion circuit 100 for limiting maximum switching FET drain-source voltage VDS (during spiking and ringing) and its internal signal waveforms. A bridging circuit 110 is added to bridge the drains of the switching FETs Q1 10 and Q2 20. The bridging circuit 110 further includes a series connection of two opposing Zener diodes Z1 112 and Z2 114 each having a Zener voltage of Vzx. That is, the first terminal 112a of Zener diode Z1 112 is connected to the first terminal 114a of Zener diode Z2 114. The second terminal 112b of Zener diode Z1 112 is connected to drain D1 of the switching FET Q1 10. The second terminal 114b of Zener diode Z2 114 is connected to drain D2 of the switching FET Q2 20. As a side remark, the bridged FETs circuit 101, which includes switching FETs Q1 10 and Q2 20 and bridging circuit 110, can be manufactured separately from the rest of the conversion circuit 100.

Upon a tendency of the VDS to exceed a pre-determined maximum value VDSmax, the bridging circuit 110 would automatically produce an inter-drain current flow between drain D1 and drain D2 of the respective main switching FETs Q1 10 and Q2 20. Thus, with proper selection of the Zener voltage $V_{ZX}$ when drain-source voltage $V_{D1-S1}$ exceeds VDSmax the drain-source voltage $V_{D1-S1}$ would cause a Zener breakdown of Zener diode Z1 112 with a concomitant dissipation of the stored magnetic energy of the leakage inductances thus limiting the maximum drain-source voltage $V_{D1-S1}$ to VDSmax. The ability of the bridging circuit 110 to limit the maximum switching FET drain-source voltage VDS can be clearly seen by comparing the drain-source voltage $V_{D1-S1}$ waveforms of FIG. 1B and FIG. 2B during turn off. It is important to point out that, owing to the self-voltage limiting nature of the two opposing Zener diodes Z1 112 and Z2 114, the bridging circuit 110 exhibits a non-destructive conductive breakdown upon Zener breakdown of the Zener diode Z1 112. It is further important to point out that, as long as the VDS remains below VDSmax, the Zener diode Z1 112 is reverse biased below its Zener voltage $V_{ZX}$ thus stays essentially non-conductive. Consequently, the bridging circuit 110 also stays essentially non-conductive thus it does not interfere with the otherwise normal operation of the present invention push pull power conversion circuit 100. As a quantitative embodiment of the present invention where the DC supply 6 is limited to a maximum value of $V_{IN\_MAX}$, the Zener voltage $V_{ZX}$ can be selected to be slightly higher than or equal to $2*V_{IN\_MAX}$ thus limiting the maximum VDS to a value of about $V_{IN\_MAX}+\frac{1}{2}Vzx$. This is a much lower value than the prior art. Therefore, FETs can be used with a much lower breakdown voltage rating than was possible with the prior art, allowing better efficiency and lower Rdson and/or costs. The Zener diode Z2 114 and the FET Q2 20 work in a similar way when the FET Q2 is abruptly switched off with an abrupt down transition of the gate-source voltage $V_{G2-S2}$. By now it should become clear to those skilled in the art that, as long as the Zener diodes Z1 112 and Z2 114 are connected with opposing polarity the bridging circuit 110 would function as described. In other words, the polarity of BOTH Zener diode Z1 112 and Z2 114 can be simultaneously reversed from that shown in FIG. 2A without affecting the functionality of the bridging circuit 110 (however if the Zener diode 112 is made on the same die as the FET Q1 10, as will be shown in FIGS. 4A-4C, the diode polarities should not be reversed). Furthermore, while specifically illustrated in FIG. 2A for working with N-channel switching FETs Q1 10 and Q2 20, the present invention can be readily modified to work with P-channel FETs as well and this will be presently described.

Figure 3A:
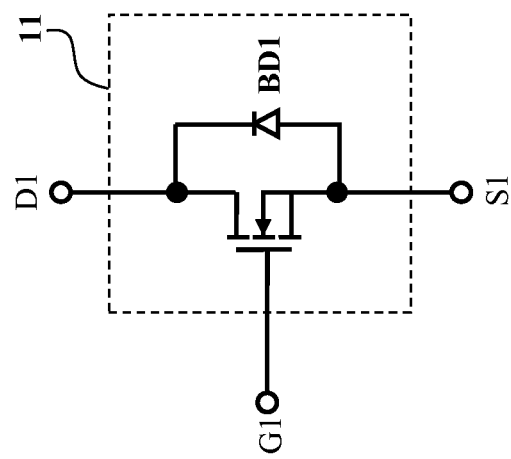
FIG. 3A, FIG. 3B and FIG. 3C illustrate a prior art switching N-channel FET and top views of its corresponding semiconductor die structure.
Figure 3B:
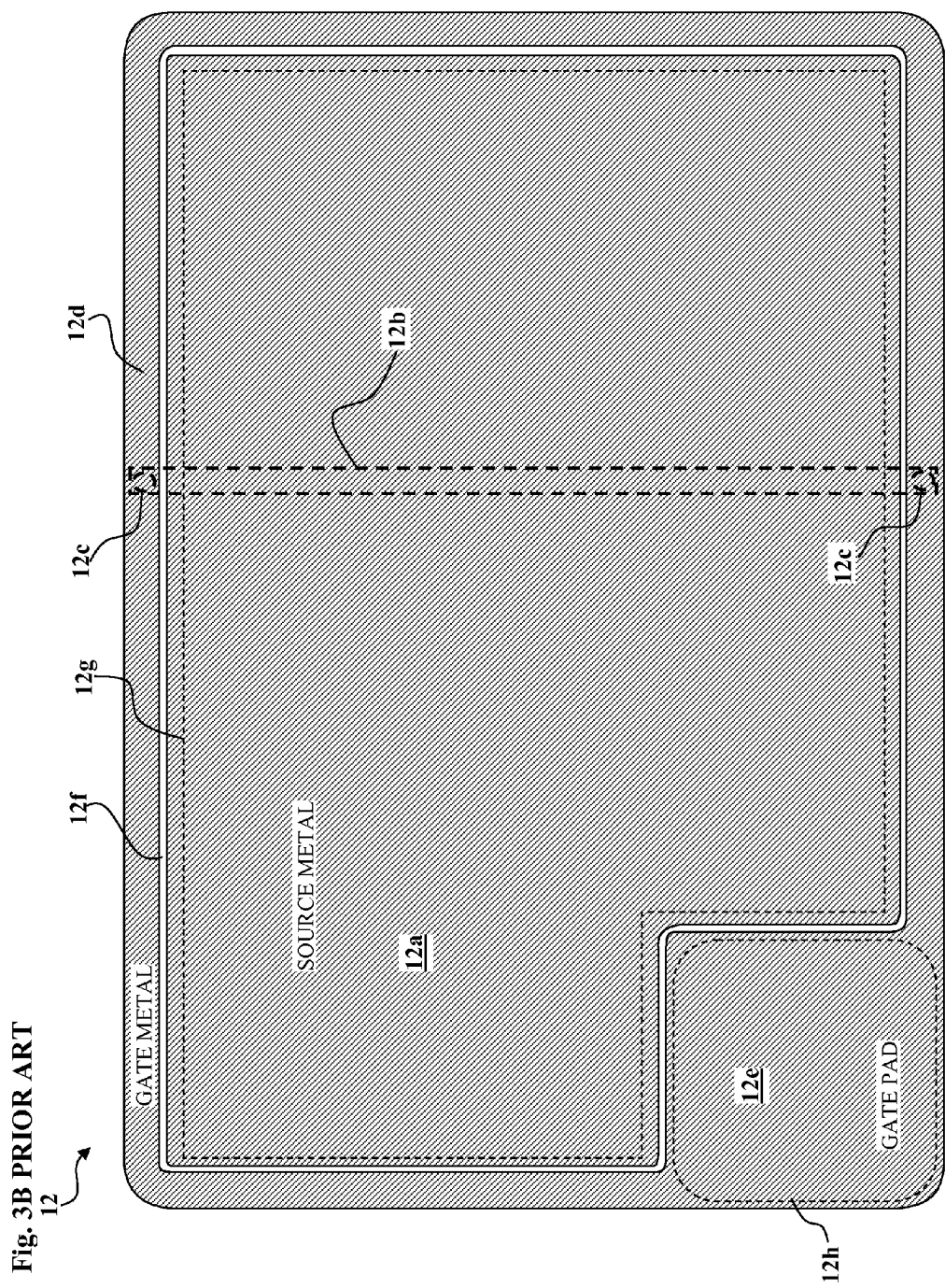
Figure 3C:
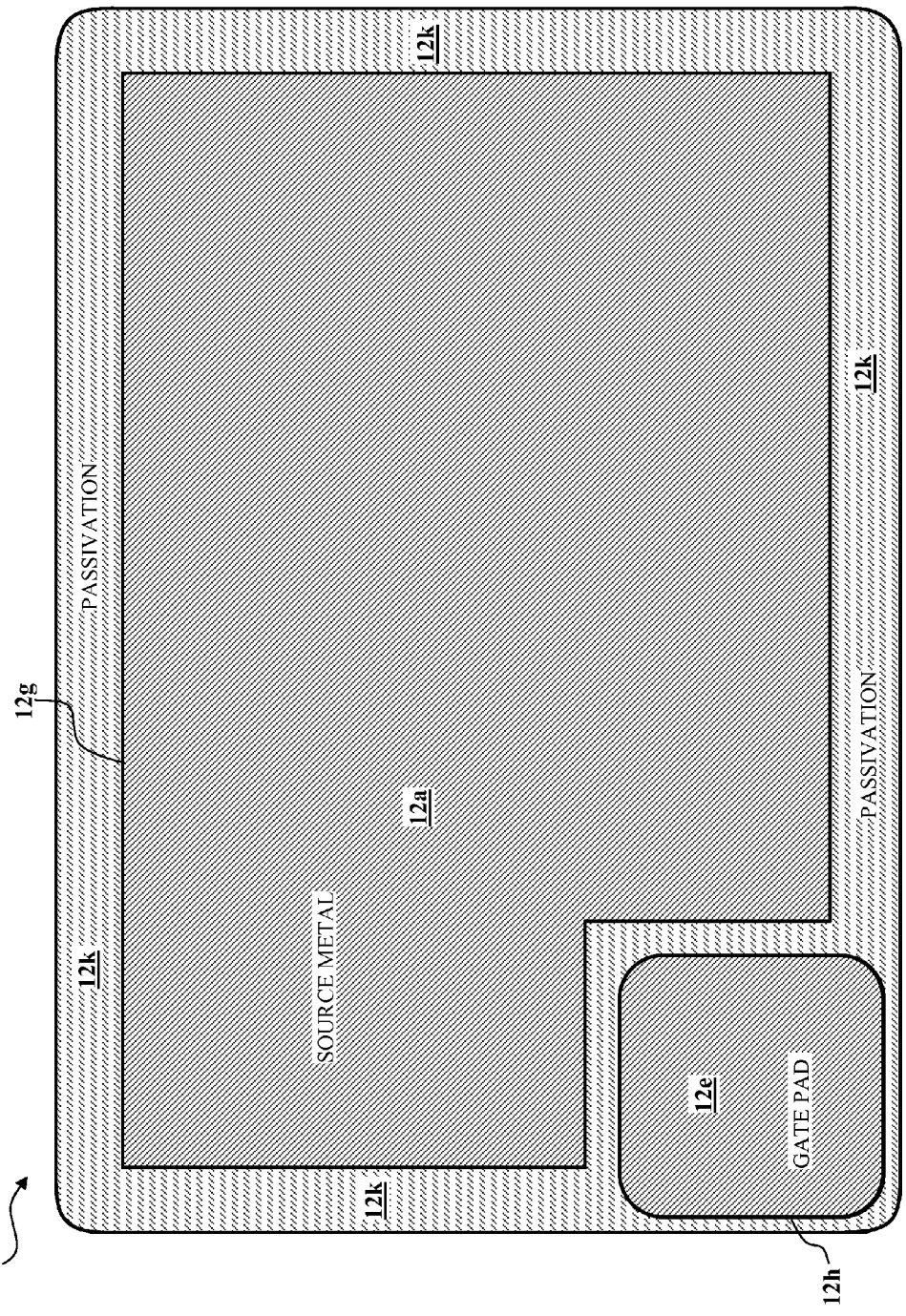

For illustrations leading to semiconductor die level embodiments of the present invention, FIG. 3A, FIG. 3B and FIG. 3C illustrate a prior art switching N-channel FET 11 and top views of a typical corresponding semiconductor die structure. FIG. 3A is a circuit schematic of the N-channel FET 11 with source S1, gate G1, drain D1 and built-in body diode BD1. FIG. 3B is a top view of a corresponding N-channel FET die 12 with its top passivation 12k removed to reveal two passivation windows 12g and 12h plus an underlying source metal 12a surrounded by a gate metal 12d with a gate pad 12e for making external electrical contact. The source metal 12a and the gate metal 12d are separated from each other by a metal gap 12f. The area under the source metal 12a contains the active area, where the transistors are located. Under the surface, gate runner trenches 12b with its two end gate runner-metal contacts 12c run underneath the source metal and provide electrical connection from the gate metal 12d to the transistors gates in the active area. While the gate structure has multiple gate runner trenches connected in parallel for a correspondingly increased current handling capacity, to avoid obscuring details only one gate runner trench 12b is shown here for simplicity. The drain D1 of the N-channel FET 11 is located at the bottom of the N-channel FET die 12 thus is not visible from the top view. FIG. 3C is a top view of the corresponding N-channel FET die 12 with restored top passivation 12k having passivation windows 12g and 12h.

FIG. 4A and FIG. 4B illustrate a present invention power switching device with integrated VDS-clamping 115 having a main switching N-channel FET 11 plus a Zener diode Z1 112 and a top view of its corresponding FET with integrated VDS-clamping die 116. The N-channel FET 11 has a source S1, a drain D1 and a gate G1. The Zener diode Z1 112 has a first terminal 112a as its anode and a second terminal 112b as its cathode. The second terminal 112b of the Zener diode Z1 112 is connected to the drain D1 of the N-channel FET 11. With reference to the present invention push pull power conversion circuit 100 of FIG. 2A, upon connection of two of the power switching devices with integrated VDS-clamping 115 as the pair of main switching FETs of a transformer-coupled push pull power conversion circuit with a maximum DC supply voltage $V_{IN\_MAX}$ and having the first terminals 112a of the two corresponding Zener diodes connected to each other, the two power switching device with integrated VDS-clamping 115 together perform an associated task of push pull power switching while clamping the maximum VDS to a value of about $V_{IN\_MAX}+\frac{1}{2}Vzx$ (where Vzx can be selected to be slightly greater than or equal to $2*V_{IN\_MAX}$). In FIG. 4B the Zener anode metal 116p of Zener diode Z1 112 is isolated from the source metal 12a with the passivation 12k while the Zener cathode metal, being connected to the drain D1 at the bottom surface, is not visible here.

FIG. 4C illustrates a cross sectional view, across section B-B of FIG. 4B, of an FET with integrated VDS-clamping semiconductor die 116 corresponding to the present invention switching device with integrated VDS-clamping 115. To facilitate clarity of illustration, an equivalent circuit schematic in dashed lines is superimposed onto the illustrated semiconductor die cross sectional structure. The FET with integrated VDS-clamping die 116 has an N+ substrate 12n atop a bottom drain metal 12m. A common N-layer, an N– epi 12p, for hosting various device components thereon is located atop the N+ substrate 12n. To avoid unnecessary obscuring details only two parallel source metals 12a, only two parallel trench gates 116c and only three parallel Zener diodes Z1 112 are illustrated here. Thus, for example, the two source metals 12a are interconnected through a three-dimensional (3D) source metal connection 116a. The two trench gates 116c are interconnected through a 3D gate connection 116d. However, the anode metal of the three parallel Zener diodes Z1 112 are integrated into a single Zener anode metal 116p. It should be understood that, in practice, any of a large number of parallel trench gates and Zener diodes can be implemented within the FET with integrated VDS-clamping die 116 subjecting to considerations like minimum structural feature size, maximum device size and cost, etc. The various parallel trench gates 116c and parallel Zener diodes Z1 112 are further isolated from one another through some of the field oxide regions 116q. Thus, the switching FET is embodied in a bottom-drain trench FET, the Zener diode is embodied in a bottom-cathode configuration and the switching FET and the Zener diode are formed on the single die 116 by sharing their respective bottom-drain and bottom-cathode with the N− epi 12*p* and the N+ substrate 12*n*.

As mentioned before, the present invention can be readily modified to work with P-channel FETs as well. For this propose, FIG. 5A shows a circuit schematic illustrating a Zener-clamped dual P-channel switching device 130 under the present invention for limiting the maximum VDS of the switching P-channel FETs Q1 132 and Q2 134 when they are used in a transformer-coupled push pull power converter. Notice that the first terminal 112*a* of the Zener diode Z1 112 is its anode which is in turn connected to the drain D1 of the P-channel FET Q1 132, etc. FIG. 5B illustrates a sectional view of an FET with integrated VDS-clamping die 136 corresponding to the Zener-clamped dual P-channel switching device 130 using a P-channel FET. The P-channel FET Q1 132 and the Zener diode Z1 112 are hosted in a P− epi 136*p* atop a P+ substrate 136*n* with a drain metal 12*m* contact. The components in FIG. 5B are the same as those in FIG. 4C except that their polarities are reversed.

As a further illustration of a preferred embodiment of the present invention, FIG. 6 shows the top view of a system of two co-packaged N-channel FET dies each with integrated VDS-clamping 140. This is a co-packaged embodiment of the bridged FETs circuit 101 of FIG. 2A. The two co-packaged FET dies are FET with integrated VDS-clamping die-1 142*a* and FET with integrated VDS-clamping die-2 142*b* respectively bonded to conductive leadframe pads 146. The conductive leadframe pads 146 are further seated atop a nonconductive platform 148 with numerous leadframe leads 150 extended along its periphery. Bond wires 144 are used to interconnect the two FET dies and to connect the two co-packaged FET dies to the leadframe leads 150. Finally, the system of two co-packaged FET dies is encapsulated as illustrated with a package epoxy filling outline 152 which can also serve to hold some of the leadframe leads 150 in place.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed is:

1. A power switching device comprises:
  a main switching MOSFET disposed on an epitaxial layer lightly doped with first conductivity type overlaying a substrate layer heavily doped with said first conductivity type, said MOSFET having a plurality of interconnected source, a plurality of interconnected trench gate and a drain having a drain metal disposed on a bottom of said heavily doped substrate; and a Zener diode with a Zener voltage of Vzx and having a first terminal and a second terminal, the first terminal being electrically isolated from the source and the gate, the second terminal of the Zener diode being further connected to the drain metal.

2. The power switching device of claim 1 wherein the main switching MOSFET is an N-channel FET and the second terminal of the Zener diode is its cathode.

3. The power switching device of claim 1 wherein the main switching FET is a P-channel FET and the second terminal of the Zener diode is its anode.

4. A semiconductor package for power switching application comprises:
  A first semiconductor die disposed on a first conductive die pad of a lead frame, said first semiconductor die comprising a first main switching FET having a first source terminal, a first drain terminal and a first gate terminal; and
  a first Zener diode with a Zener voltage of Vzx and having a first terminal and a second terminal, the second terminal of the Zener diode being further connected to the drain terminal.

5. The semiconductor package for power switching application of claim 4, wherein the first terminal of the first Zener diode being electrically isolated from the first source terminal and the first gate terminal.

6. The semiconductor package for power switching application of claim 4, further comprising a second semiconductor die comprising a second main switching FET having a second source terminal, a second drain terminal and a second gate terminal; and
  a second Zener diode with a Zener voltage of Vzx and having a third terminal and a forth terminal, the forth terminal of the Zener diode being further connected to the second drain terminal.

7. The semiconductor package for power switching application of claim 6, wherein the first terminal of the first Zener diode being electrically connected to the third terminal of the second Zener diode.

8. The semiconductor package for power switching application of claim 6, wherein the first source terminal of the first main switching FET being electrically connected to the second source terminal of the second main switching FET.

9. The semiconductor package for power switching application of claim 4, wherein the first conductive die pad and a second conductive die pad of the lead frame are electrically isolated.

10. The semiconductor package for power switching application of claim 6, wherein the first and second FETs are N-channel MOSFETs and the first terminal of the first Zener diode and the third terminal of the second Zener diode being anodes.

* * * * *